US010127863B2

(12) United States Patent
Jeon et al.

(10) Patent No.: US 10,127,863 B2
(45) Date of Patent: Nov. 13, 2018

(54) ORGANIC LIGHT EMITTING DISPLAY DEVICE

(71) Applicant: SAMSUNG DISPLAY CO., LTD., Yongin-si, Gyeonggi-do (KR)

(72) Inventors: Jin-Young Jeon, Yongin-si (KR); Young Kim, Yongin-si (KR); Ho-Hyun Song, Yongin-si (KR)

(73) Assignee: SAMSUNG DISPLAY CO., LTD., Yongin, Gyeonggi-do (KR)

( * ) Notice: Subject to any disclaimer, the term of this patent is extended or adjusted under 35 U.S.C. 154(b) by 0 days.

(21) Appl. No.: 15/866,591

(22) Filed: Jan. 10, 2018

(65) Prior Publication Data

US 2018/0130422 A1 May 10, 2018

Related U.S. Application Data

(63) Continuation of application No. 14/674,563, filed on Mar. 31, 2015, now Pat. No. 9,905,167.

(30) Foreign Application Priority Data

Jun. 9, 2014 (KR) ........................ 10-2014-0069508

(51) Int. Cl.
*G09G 3/3275* (2016.01)

(52) U.S. Cl.
CPC ......... *G09G 3/3275* (2013.01); *H05K 999/99* (2013.01); *G09G 2310/027* (2013.01); *G09G 2310/0245* (2013.01); *G09G 2320/0257* (2013.01); *G09G 2320/046* (2013.01); *G09G 2330/021* (2013.01)

(58) Field of Classification Search
CPC ......... G09G 3/3275; G09G 2310/0245; G09G 2310/027; G09G 2320/0257; G09G 2320/046; G09G 2330/021
See application file for complete search history.

(56) References Cited

U.S. PATENT DOCUMENTS

| | | | | |
|---|---|---|---|---|
| 7,148,885 | B2 | 12/2006 | Nose | |
| 2002/0063674 | A1 | 5/2002 | Chiang | |
| 2002/0126114 | A1 | 9/2002 | Yatabe | |
| 2002/0190973 | A1 | 12/2002 | Morita | |
| 2004/0222943 | A1 | 11/2004 | Kudo | |
| 2004/0233226 | A1* | 11/2004 | Toriumi | G09G 3/3648 345/690 |

(Continued)

FOREIGN PATENT DOCUMENTS

| | | |
|---|---|---|
| KR | 10-2012-0002069 | 1/2012 |
| KR | 10-2012-0104895 | 9/2012 |

*Primary Examiner* — Mihir K Rayan
(74) *Attorney, Agent, or Firm* — Lee & Morse P.C.

(57) ABSTRACT

An organic light emitting display device includes a controller to control a first area and a second area of a display based on a predetermined condition. The controller simultaneously controls the pixels in the first area to display an image and controls the pixels in the second area to display light having a same gray scale value. The predetermined condition may be a user command or an operational condition, power mode, or status of a host device. The same gray scale value may be a lowest gray scale value in a predetermined range. The first and second areas may have different contours, and may be located at respective main and peripheral display locations of the host device.

11 Claims, 3 Drawing Sheets

(56) References Cited

U.S. PATENT DOCUMENTS

| | | | | |
|---|---|---|---|---|
| 2005/0093850 | A1 | 5/2005 | Mori et al. | |
| 2006/0132474 | A1 | 6/2006 | Lam | |
| 2007/0063959 | A1 | 3/2007 | Iwabuchi et al. | |
| 2009/0115771 | A1 | 5/2009 | Washio | |
| 2010/0164913 | A1* | 7/2010 | Lin, Jr. | G09G 3/3688 345/205 |
| 2011/0151935 | A1 | 6/2011 | Oksman et al. | |
| 2011/0164020 | A1 | 7/2011 | Cho et al. | |
| 2012/0001950 | A1 | 1/2012 | Kim | |
| 2012/0032935 | A1* | 2/2012 | Yen | G09G 3/20 345/211 |
| 2012/0206506 | A1 | 8/2012 | Kim et al. | |
| 2013/0300697 | A1 | 11/2013 | Kim et al. | |
| 2015/0279322 | A1 | 10/2015 | Douglas | |

* cited by examiner

ORGANIC LIGHT EMITTING DISPLAY DEVICE

CROSS-REFERENCE TO RELATED APPLICATIONS

This is a continuation application based on pending application Ser. No. 14/674,563, filed Mar. 31, 2015, the entire contents of which is hereby incorporated by reference.

Korean Patent Application No. 10-2014-0069508, filed on Jun. 9, 2014, and entitled, "Organic Light Emitting Display Device," is incorporated by reference herein in its entirety.

BACKGROUND

1. Field

One or more embodiments described herein relate to an organic light emitting display device.

2. Description of the Related Art

An organic light emitting display device uses pixels that include organic light emitting diodes. These diodes generate light based on a recombination of electrons and holes in an active layer. The images generated by the pixels may be displayed on any one of a variety of display panels. Examples include flat, flexible, and curved panels.

In a display panel of a mobile device, the panel may operate in a low power mode in order to decrease power consumption. Also, display panels have been made with divided screens. Different areas of the divided screen may be selectively turned on or off in low power mode. The turned-off areas display black data in order to prevent an afterimage effect from occurring.

SUMMARY

In accordance with one or more embodiment an organic light emitting display device includes a pixel unit including a plurality of pixels connected to scan lines and data lines, the pixel unit divided into a plurality of display areas; a scan driver to supply a scan signal to the scan lines; a data driver to supply data signals to the data lines, the data driver including a plurality of source channel buffers connected to the data lines; an amplifier to output a voltage corresponding to a predetermined gray scale value; and a selector to selectively connect a first set of the data lines to the amplifier and to turn off power to the source channel buffers that correspond to the first set of data lines, wherein the first set of the data lines correspond to a first display area of the pixel unit The selector may include an output to output a control signal to turn off the first display area, and a plurality of first switches connected between the data lines and the amplifier, the first switches to turn on in response to the control signal.

The data driver may include a plurality of second switches connected to power supply lines of the source channel buffers, the second switches to turn off in response to the control signal. The first switches and the second switches may have different conductivity types.

The voltage received by the amplifier may correspond to a lowest gray scale value output from a gamma circuit. The amplifier may charge the voltage corresponding to the lowest gray scale value for the first frame period, and output the charged voltage from the second frame in a low power mode, in which at least one of the display areas of the pixel unit is inactivated.

The display areas may be along an axis that is substantially parallel to the data line. The first display area may corresponds to a flat region of a display panel; and the display area includes a second display area that corresponds to a curved region of the display panel. The source channel buffers may include a number of first source channel buffers corresponding to the first display area and a number of second source channel buffers corresponding to the second display area.

In accordance with another embodiment, an apparatus includes an output and a controller to control a first area and a second area of a display based on a predetermined condition, wherein each of first and second areas has a plurality of pixels and wherein the controller is coupled to the output to simultaneously control the pixels in the first area to display an image and to control the pixels in the second area to display light having a same gray scale value.

The predetermined condition may include receiving a user command. The predetermined condition may include an operational condition, power mode, or status of a host device. The power mode may be a low power mode of the host device.

The same gray scale value may be a lowest gray scale value in a predetermined range of gray scale values. The lowest gray scale value in the predetermined range may be a black gray scale value.

The pixels in the first area may display the image and the pixels in the second area may display light having the same gray scale value based on a same control signal output from the controller. The same control signal may connect data lines of the first area to receive data corresponding to the image, and may connect data lines of the second area to receive data corresponding to the same gray scale value.

The first area may have a first contour, and the second area may have a second contour different from the first contour. The first contour may be substantially flat, and the second contour may be substantially curved. The first area may be a main display area of a host device and the second area may be a peripheral display area of the host device.

BRIEF DESCRIPTION OF THE DRAWINGS

Features will become apparent to those of skill in the art by describing in detail exemplary embodiments with reference to the attached drawings in which.

DETAILED DESCRIPTION

Figure 1A:
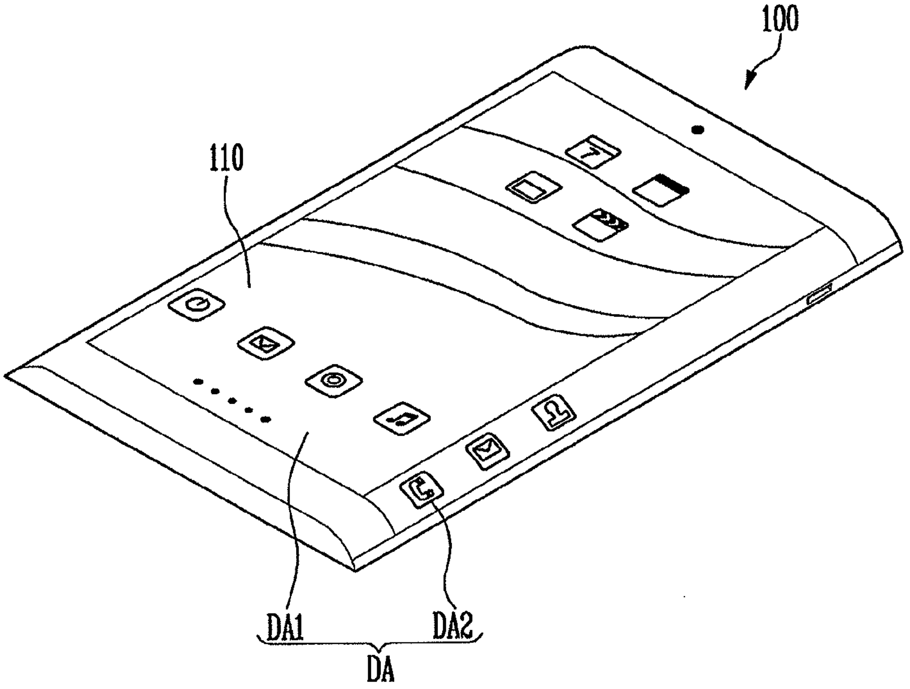
FIG. 1A illustrates an embodiment of a portable terminal.

Example embodiments are described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or element, it can be directly on the other layer or element, or intervening or elements may also be present. Further, it will be understood that when a layer or element is referred to as being "under" another layer, it can be directly under, and one or more intervening layers or elements may also be present. In addition, it will also be understood that when a layer or element is referred to as being "between" two layers, it can be the only layer or element between the two layers, or one or more intervening layers or elements may also be present. Like reference numerals refer to like elements throughout.

Figure 1B:
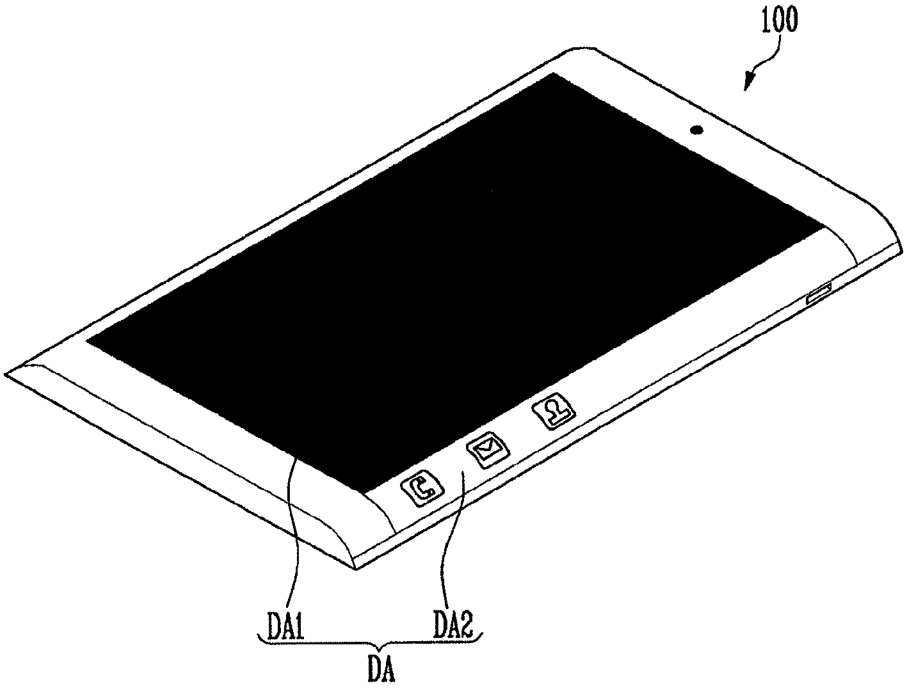
FIGS. 1B and 1C illustrate different operational states of the portable terminal in a low power mode.
Figure 1C:
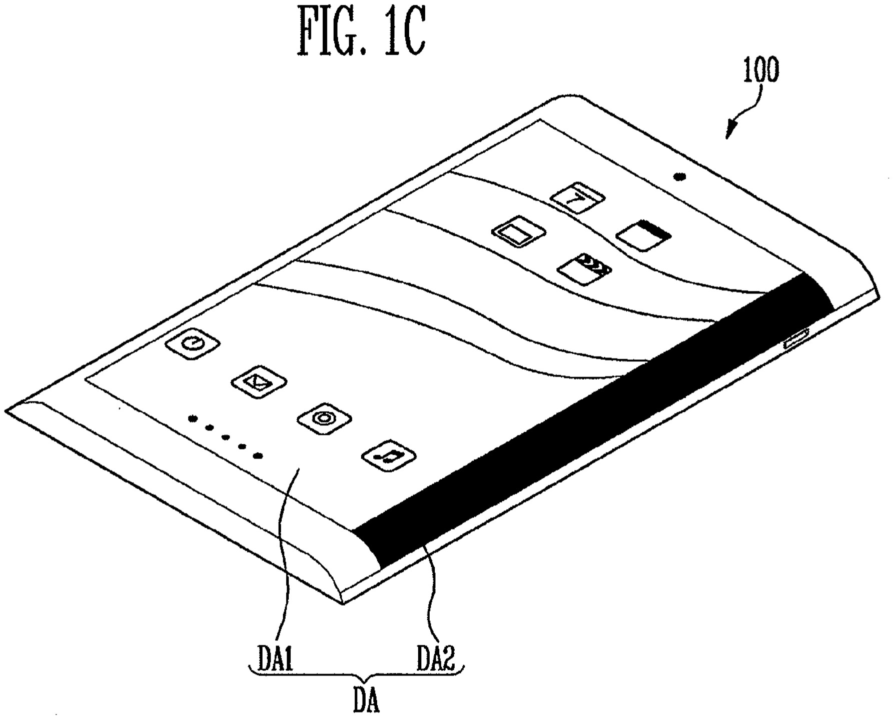

FIG. 1A illustrates an embodiment of a portable terminal 100, and FIGS. 1B and 1C illustrate different screens of the portable terminal 100 in a low power mode. The portable terminal 100 may be any one of a variety of electronic devices including but not limited to a smart phone.

Referring to FIGS. 1A, 1B, and 1C, a display panel 110 of the portable terminal 100 may be an organic light emitting display panel. The display panel 110 may be, for example, a curved panel having curved side regions. The display panel 110 is divided into a plurality of display areas DA. In one embodiment, the display panel 110 is divided into a first display area DA1 and a second display area DA2, the latter of which corresponds to the curved region. In another embodiment, a shape of the display panel 110 may be different and/or the number of divided areas may be greater than two.

The portable terminal 100 may operate in a low power mode, for example, in order to decrease power consumption. In the low power mode, at least some of the divided display areas may be selectively turned on and off. In accordance with one embodiment, a turned-on display area may correspond to an area in which an image is normally output or displayed. A turned-off display area may correspond to an area in which an image is not displayed or output, for example, as if power is turned off.

In one embodiment, black data displaying a black pixel value is output in a turned-off display area to prevent an afterimage effect. For example, in the low power mode, the first display area DA1 may be turned off as illustrated in FIG. 1B, or the second display area DA2 may be turned off as illustrated in FIG. 1C. The area to be turned off or on may be determined, for example, based on a user selection or signal and/or based on an operating condition, power mode, or status of the portable terminal or display.

Figure 2:
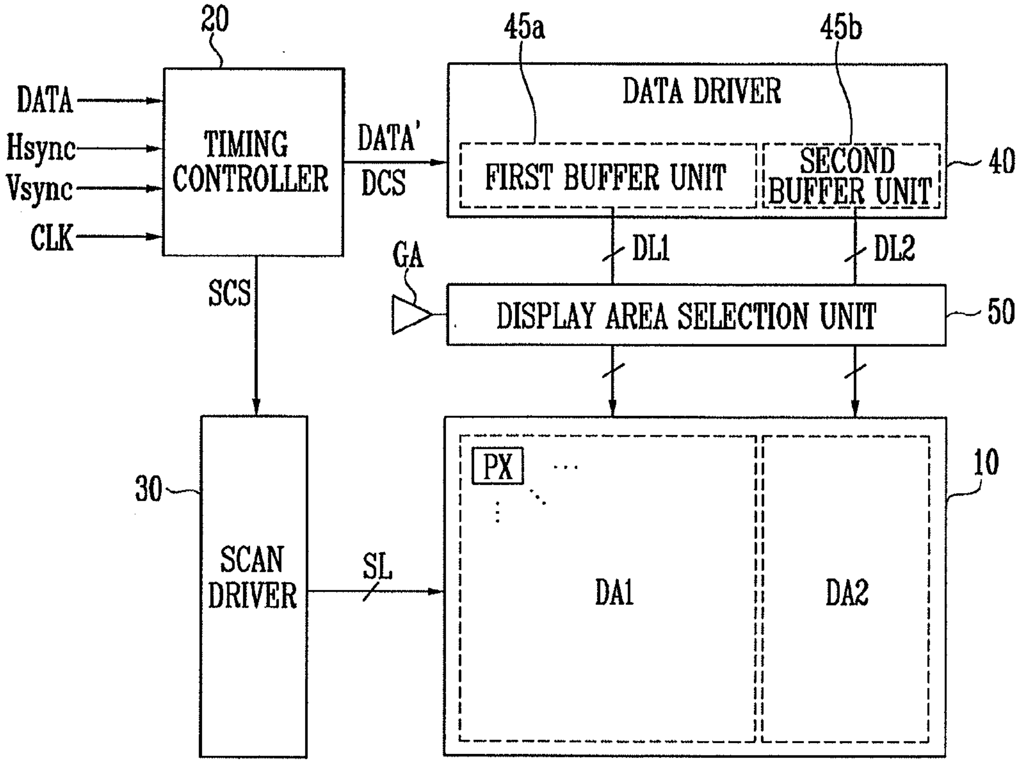
FIG. 2 illustrates an embodiment of organic light emitting display device.

FIG. 2 illustrates an embodiment of an organic light emitting display device, which, for example, may include or correspond to display panel 110 as illustrated in FIG. 1A. Referring to FIG. 2, the organic light emitting display device may include a pixel unit 10, a timing controller 20, a scan driver 30, a data driver 40, an amplifier GA, and a display area selection unit 50.

The pixel unit 10 includes a plurality of pixels PX connected to a plurality of scan lines SL and a plurality of data lines DL1 and DL2. The scan lines SL extend in a first direction to transmit scan signals. The data lines DL1 and DL2 extend in a second direction crossing the first direction to transmit data signals. The pixels PX are arranged in a matrix form. In one embodiment, the pixels PX may includes organic light emitting diodes (OLEDs) which receive power from an external source to emit light with a luminance that corresponds to a data signal. The pixels PX may also include switching elements for controlling the flow of driving current. The pixel circuits of the pixels PX may have any one of a variety of structures.

The pixel unit 10 is divided into the display areas DA1 and DA2. The display areas DA1 and DA2 may be divided in a predetermined direction, e.g., horizontally, vertically, or otherwise. In the embodiment of FIG. 2, the display areas are defined relative to an axis that is parallel to the data lines DL1 and DL2.

The data line DL1 and DL2 may be grouped based on the display areas DA1 and DA2 to be divided. For example, the first data lines DL1 supply data signals to the pixels PX in the first display area DA1, and the second data lines DL2 supplies data signals to the pixels PX in the second display area DA2. In FIG. 2, the pixel unit 10 is vertically divided into the first and second display areas DA1 and DA2. In other embodiments, the number and/or sizes of the display areas DA1 and DA2 may be different.

The timing controller 20 receives image data DATA from an external image source and a number of input signals. The input signals may include, for example, a horizontal synchronization signal Hsync, a vertical synchronization signal Vsync, and a clock signal CLK for controlling display of the image data DATA. The timing controller 20 may process the input image data DATA and generate image data DATA' corrected to be appropriate to display of an image of the display unit 10. The timing controller 20 also provides the data driver 40 with the generated image data DATA'. Further, the timing controller 20 generates and outputs driving control signals SCS and DCS controlling driving of the scan driver 30 and the data driver 40 based on the input control signals.

The scan driver 30 is connected to the scan lines SL and generates a scan signal in response to scan control signals SCS of the timing controller 20. The scan driver 30 outputs the scan signal to the scan lines SL. The pixels PX of each row are sequentially selected according to the scan signal, so that the data signal may be provided. The scan driver 30 may supply the scan signal according to a predetermined scan frequency. The scan frequency may be controlled by the timing controller 20.

The data driver 40 is connected to the data lines DL1 and DL2 and generates data signals in response to data control signals DCS of the timing controller 20. The data driver 40 outputs the data signals to the data lines DL1 and DL2. The data driver 40 converts the image data DATA', which is in a digital form provided from the timing controller 20, to data signals in analog form. The data signals are then output to the data lines DL1 and DL2. The data signals may be generated based on gray scale voltages (or gamma voltages). The data driver 40 may receive the gray scale voltages, for example, from gamma circuit. The data driver 40 sequentially transmits the data signals to respective ones of the pixels in a predetermined row in the pixel unit 10.

Also, the data driver 40 includes a plurality of buffer units 45*a* and 45*b* that respectively correspond to the display areas DA1 and DA2 of the pixel unit 10. Each of the buffer units 45*a* and 45*b* may include a plurality of source channel buffers, and operates to stabilize output of the data signal. The buffer units 45*a* and 45*b* output the data signals to the pixel unit 10 through corresponding data lines DA1 or DA2.

In one embodiment, the first buffer unit 45*a* outputs data signals to the pixels PX of the first display area DA1 through the first data lines DL1, and the second buffer unit 45*b* outputs the data signals to the pixels PX of the second display area DA2 through the second data lines DL2.

The display area selection unit 50 selectively connects the data lines DL1 and DL2 to the pixel unit 10 to the data driver 40 supplying the data signals or to the amplifier GA which outputs a predetermined voltage, e.g., a voltage corresponding to a black gray scale value. In one embodiment, the display area selection unit 50 connects one or more data lines corresponding to at least one of the display areas DA1 and DA2 to the amplifier GA, and turns off power of the source channel buffers corresponding to the one or more data lines. For example, the display area selection unit 50 connects the first data lines DL1 corresponding to the first display area DA1 to the amplifier GA, and turns off power of the first buffer unit 45*a* connected to the first data lines DL1. Accordingly, the first display area DA1 displays black data (e.g., light having a black gray scale value) in a turned-off state, and the second display area DA2 displays an image. The amplifier may be a global amplifier or another type of amplifier. In an alternative embodiment, the predetermined voltage may correspond to a gray scale value different from a black value.

Figure 3:
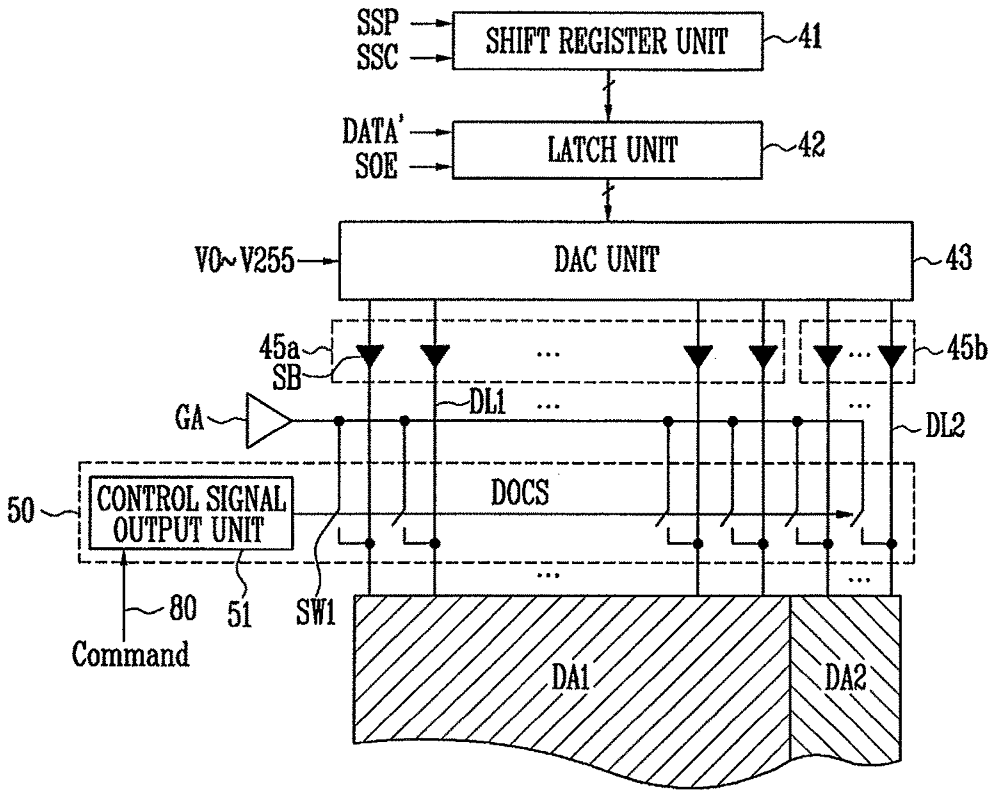
FIG. 3 illustrates an embodiment of a data driver and display area selection unit.
Figure 4:
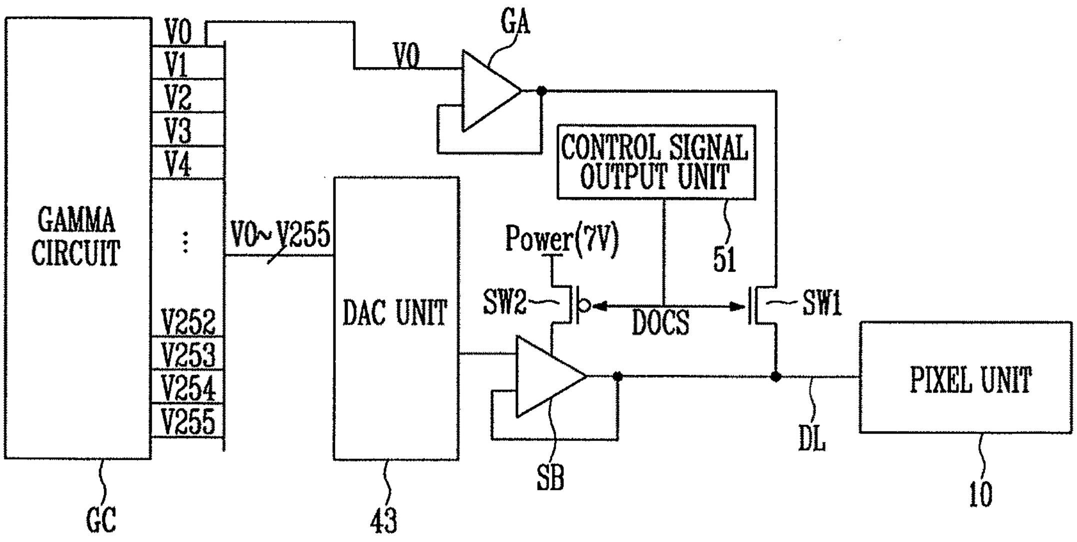
FIG. 4 illustrates operations for driving a display device in one embodiment.

FIG. 3 illustrates an embodiment of a data driver and a display area selection unit, which, for example, may respectively correspond to the data driver 40 and display area selection unit 50 illustrated in FIG. 2. FIG. 4 is an embodiment of a circuit diagram illustrating an embodiment of a driving method in the low power mode.

Referring to FIGS. 3 and 4, the data driver 40 includes a shift register unit 41, a latch unit 42, a Digital-Analog Converter (DAC) unit 43, and the buffer units 45*a* and 45*b*. The data driver 40 may receive the image data DATA' and the data control signal DCS from the timing controller 20. The data control signal DCS may include, for example, a source start pulse SSP, a source shift clock SSC, a source output enable SOE, and a bias control signal DBCS. The data driver 30 may receive gray scale voltages (V0 to V255) from a gamma circuit GC.

The shift register unit 41 shifts the source start pulse SSP received from the timing controller 20 within a first horizontal time (1H time) according to the source shift clock SSC, and sequentially generates a sampling signal. In one embodiment, the shift register unit 41 may include a plurality of shift registers.

The latch unit 42 may include a first latch unit sequentially latching the image data DATA' from the timing controller 20 in response to the sampling signal from the shift register unit 41. A second latch unit may latch data of a first horizontal line, latched by the first latch unit in parallel, to increase time of the source output enable SOE. The latched data may be supplied to the DAC unit 43.

When the image data DATA' is input from the latch unit 42, the DAC unit 43 generates an analog voltage corresponding to the digital image data DATA'. The analog voltage is then output to the buffer units 45*a* and 45*b*. The DAC unit 43 receives the gray scale voltages (V0 to V255) from a gray voltage generation unit, and generates a plurality of data voltages in response to the image data DATA'. In one embodiment, the DAC unit 43 may include a plurality of DACs.

The buffer units 45*a* and 45*b* supply the data voltages from the DAC unit 43 to respective ones of the data lines DL1 and DL2. Each of the buffer units 45*a* and 45*b* may include a plurality of source channel buffers SB. The source channel buffer SB may be or include, for example, an operating amplifier. The buffer units 45*a* and 45*b* are divided to correspond to the display areas DA1 and DA2 of the pixel unit 10. The source channel buffers SB in each of the buffer units 45*a* and 45*b* may also be grouped and divided to correspond to the display areas DA1 and DA2. In one embodiment, the first buffer unit 45*a* is formed of the source channel buffers SB connected with the first data lines DL1, and the second buffer unit 45*b* is formed of the source channel buffers SB connected with the second data lines DL2.

The display area selection unit 50 may include a control signal output unit 51 which outputs a display area off control signal DOCS for turning off at least one of the display areas DA1 and DA2. The control signal output unit 51 may generate and output the display area off control signal DOCS, for example, according to a display area selection command 80 input from the user and/or based on a control signal automatically generated based on a predetermined operational condition, power mode, or status of the portable device or panel. The display area selection unit may be considered to be a type of controller.

In order to selectively control the display areas DA1 and DA2, the display area selection unit 50 may be connected between the data line DL and the amplifier GA. The display area selection unit 50 may include a plurality of first switching units SW1 which are turned on in response to the display area off control signal DOCS. The data driver 40 is connected to power supply lines of the source channel buffers SB, and may include a plurality of second switching units SW2 which are turned-off in response to the display area off control signal DOCS.

In one embodiment, one of the first switching unit SW1 or the second switching unit SW2 may be a PMOS transistor and the other one may be an NMOS transistor, or vice versa. For example, the first switching unit SW1 and the second switching unit SW2 may perform different operations in response to the same display area off control signal DOCS. As a result, a circuit may be configured in which the data lines DL which extend to the pixel unit 10 are selectively connected to one of the source channel buffer SB or the amplifier GA. In an alternative embodiment, different control signals may be used to selectively control the on/off status of the display areas DA1 and DA2.

The first and second switching units may be transistors of different conductivity types. For example, when the first switching unit SW1 is an NMOS transistor and the second switching unit SW2 is a PMOS transistor, the first switching unit SW1 is turned on and the second switching unit SW2 is turned off when the display area off control signal DOCS has a high voltage level. When the first switching unit SW1 is turned on, the data line DL is connected with the amplifier GA. When the second switching unit SW2 is turned off, power supply to the source channel buffer SB connected to the data line DL is cut. Because the power of the source channel buffer SB is turned off, the source channel buffer SB stops output of the data signal and assumes a floating state. As a result, a black voltage output from the amplifier GA is applied to the data line DL. Each of pixels of the pixel unit 10 connected to the data line DL, to which the black voltage is applied, display a black gray scale value.

The display area off control signal DOCS may be applied to the first switching unit SW1 and the second switching unit SW2 corresponding to the selected display area. In one embodiment, the first switching units SW1 of the display area selection unit 50 are grouped and driven to correspond to the first display area DA1 and the second display area DA2. Further, the second switching units SW2, which control the power supply of the source channel buffers SB, may be grouped into the first buffer unit 45*a* corresponding to the first display area DA1 and the second buffer unit 45*b* corresponding to the second display area DA2 to be driven.

FIG. 3 illustrates that all of the first switching units SW1 are controlled in the same control line. In another embodiment, the circuit may be configured so that the first switching units SW1 and the second switching units SW2 are grouped and controlled by different control lines corresponding to the display areas DA1 and DA2. That is, the display area off control signal DOCS for turning off the first display area DA1 may be input as a common single signal to the first switching units SW1 and the second switching units SW2 corresponding to the first display area DA1. The display area off control signal DOCS for turning off the second display area DA2 may be input as a common single signal to the first switching units SW1 and the second switching units SW2 corresponding to the second display area DA2.

The amplifier GA may receive a voltage (e.g., lowest gray scale voltage V0) corresponding to a predetermined gray scale value (e.g., black gray scale value) from the gamma circuit GC, which outputs the gray scale voltages V0 to V255. In one embodiment, the gamma circuit GC may include a resistance string for outputting the gray scale voltages (V0 to V255), and the lowest gray scale voltage V0 may be provided to the amplifier GA according to a separate electric line. In another embodiment, the predetermined voltage may be a voltage different from V0, which corresponds to a different gray scale value.

In one embodiment, the amplifier GA may charge the lowest gray scale (e.g., black) voltage V0 for the first frame period, and output the charged black voltage from the second frame in the low power mode in which at least one of the display areas DA1 or DA2 is inactivated. To output the signal to the data lines DL, the amplifier GA may require more voltage charging/discharging time than the source channel buffer SB that outputs the signal to one data line DL. Thus, when an amp-on signal for outputting the black voltage is applied, a voltage charging time for about one frame period may be required. In one embodiment, the amp-on signal may be applied at a same timing as the display area off control signal DOCS. Alternatively, the amp-on signal may be applied at a timing preceding one frame compared to the display off control signal DOCS taking the charging time into consideration.

By way of summation and review, the source channel buffer of an organic light emitting display device may continuously consume static power in a normal state, even though black data is output without charging/discharging the data voltage. As a result, a power consumption reduction effect corresponding to the output of only black data is small.

In accordance with one or more of the aforementioned embodiments, power consumption may be reduced or minimized by outputting a same gray scale value (e.g., a black gray scale value) to a first display area while an image is displayed in a second display area. Power to source channel buffers corresponding to the first display area may be turned off at this time. Control of the first and second display areas in this manner may occur according to a predetermined condition, e.g., detection of a low power mode and/or in response to a user selection signal or command.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing the methods described herein.

Also, another embodiment may include a computer-readable medium, e.g., a non-transitory computer-readable medium, for storing the code or instructions described above. The computer-readable medium may be a volatile or non-volatile memory or other storage device, which may be removably or fixedly coupled to the computer, processor, controller, or other signal processing device which is to execute the code or instructions for performing the method embodiments described herein.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the present invention as set forth in the following claims.

What is claimed is:

1. An organic light emitting display device, comprising:
- a pixel unit including a plurality of pixels connected to scan lines and data lines;
- a scan driver to supply scan signals to the scan lines;
- a data driver to supply data signals to the data lines, the data driver including a plurality of source channel buffers connected to the data lines;
- an amplifier to output a voltage corresponding to a predetermined gray scale value; and
- a selector to selectively connect a first set of data lines to the amplifier and to power off the plurality of source channel buffers that correspond to the first set of data lines,
- wherein the amplifier is commonly connected to the first set of data lines when the plurality of source channel buffers are powered off.

2. The device as claimed in claim 1, wherein the pixel unit is divided into a plurality of display areas.

3. The device as claimed in claim 2, wherein the first set of data lines correspond to a first display area of the pixel unit which is in a low power mode.

4. The device as claimed in claim 3, wherein the selector includes:
- an output to output a control signal to turn off the first display area, and
- a plurality of first switches connected between the data lines and the amplifier, the first switches to turn on in response to the control signal.

5. The device as claimed in claim 4, wherein the data driver includes:
- a plurality of second switches connected to power supply lines of the source channel buffers, the second switches to turn off in response to the control signal.

6. The device as claimed in claim 5, wherein the first switches and the second switches have different conductivity types.

7. The device as claimed in claim 3, wherein:
the first display area corresponds to a flat region of a display panel; and
the display area includes a second display area that corresponds to a curved region of the display panel.

8. The device as claimed in claim 7, wherein the source channel buffers include a number of first source channel buffers corresponding to the first display area and a number of second source channel buffers corresponding to the second display area.

9. The device as claimed in claim 2, wherein the amplifier is to:
charge the voltage corresponding to a lowest gray scale value for a first frame period, and
output the charged voltage for a second frame in a low power mode, in which at least one of the display areas of the pixel unit is inactive.

10. The device as claimed in claim 2, wherein the display areas are divided along an axis that is substantially parallel to the data lines.

11. The device as claimed in claim 1, wherein the voltage received by the amplifier corresponds to a lowest gray scale value output from a gamma circuit.

* * * * *